(12) United States Patent
Frank

(10) Patent No.: US 8,427,836 B2
(45) Date of Patent: Apr. 23, 2013

(54) POWER SEMICONDUCTOR MODULE

(75) Inventor: Thomas Frank, Lauf (DE)

(73) Assignee: Semikkro Elektronik GmbH & Co., KG, Nürnberg (DE)

( * ) Notice: Subject to any disclaimer, the term of this patent is extended or adjusted under 35 U.S.C. 154(b) by 287 days.

(21) Appl. No.: 12/939,004

(22) Filed: Nov. 3, 2010

(65) Prior Publication Data
US 2011/0103024 A1   May 5, 2011

(30) Foreign Application Priority Data

Nov. 4, 2009  (DE) .......................... 10 2009 046 403

(51) Int. Cl.
H05K 7/00  (2006.01)
(52) U.S. Cl.
USPC ............................ 361/728; 361/748; 361/763
(58) Field of Classification Search .................. 361/720, 361/736, 748, 763–767, 760; 257/690–692
See application file for complete search history.

(56) References Cited

U.S. PATENT DOCUMENTS

| 5,296,739 | A * | 3/1994 | Heilbronner et al. ......... 257/687 |
| 6,881,071 | B2 | 4/2005 | Heilbronner |
| 7,042,074 | B2 | 5/2006 | Göbl et al. |
| 7,187,074 | B2 * | 3/2007 | Uchiyama et al. ............ 257/706 |
| 7,589,418 | B2 | 9/2009 | Lederer et al. |
| 7,613,008 | B2 | 11/2009 | Beckedahl et al. |
| 8,182,273 | B2 * | 5/2012 | Lederer ........................... 439/81 |
| 2003/0173579 | A1 * | 9/2003 | Ishii et al. ..................... 257/177 |

FOREIGN PATENT DOCUMENTS

| DE | 101 21 970 | 5/2001 |
| DE | 103 55 925 | 6/2005 |
| DE | 10 2004 061 936 | 7/2006 |
| DE | 10 2005 055 608 | 5/2007 |
| DE | 10 2006 006 425 | 8/2007 |
| WO | WO 2006/067021 | 6/2006 |

* cited by examiner

Primary Examiner — Hung S Bui
(74) Attorney, Agent, or Firm — The Law Offices of Roger S. Thompson

(57) ABSTRACT

A power semiconductor module in which a substrate is provided with at least one power semiconductor and has first and second contact areas, wherein a first load connection element with first contact elements provided thereon is supported on the first contact areas and a second load connection element with second contact elements provided thereon is supported on the second contact areas. Wherein at least one spring element is provided for producing a pressure contact between the contact elements and the contact areas. To reduce the structural size of the module, the pressure contact between the contact elements and the contact areas is exerted by at least one electrical component arranged between the spring element and one of the load connection elements.

13 Claims, 3 Drawing Sheets

POWER SEMICONDUCTOR MODULE

BACKGROUND OF THE INVENTION

1. Field of the Invention

The invention relates to a power semiconductor module in which a substrate is provided with at least one power semiconductor and first and second contact areas.

2. Description of the Related Art

Such a power semiconductor module is known from U.S. Pat. No. 7,589,418. In the known power semiconductor module, a substrate having first and second contact areas is supported by its underside—i.e., the side facing away from the contact areas—on a heat sink. Power semiconductors are mounted on the opposite (top) side, the power semiconductors being electrically conductively connected to the contact areas. The contact areas serve, for example, for connection to a current source. For this purpose, load connection elements produced from metal sheets may be provided, with contact feet extending from the load connection elements. To produce an electrical contact, the load connection elements are supported by their contact feet on the contact areas. To render a contact produced in this way insensitive to vibrations, impacts and the like, a pressure is exerted on the load connection elements, which forces the contact feet against the contact areas. For this purpose, the load connection elements can be forced against the contact areas by a resilient element, such as a spring, a compressed elastic layer, or the like.

In the case of power semiconductor modules of this type, further components and/or circuit boards provided with circuits are sometimes incorporated above the load connection elements. The components may be, for example, electrolytic capacitors, and the circuits may be control circuits for driving the power semiconductors. If components and/or circuit boards provided with circuits are incorporated above the load connection elements, a housing half-shell which is fixedly connected to the heat sink, and against which the spring element is supported, is usually provided to safeguard the components. Consequently, the spring element is arranged alongside the components. In a circuit board, by way of example, it is possible to provide a perforation for leading through the spring element. The relative positioning of the spring element and the components imposes a relatively high space requirement on the assembly. The provision of a perforation in a circuit board is complicated, and moreover contributes to enlargement of the circuit board and hence in turn to an even greater space requirement.

SUMMARY OF THE INVENTION

It is an object of the invention to overcome the disadvantages according to the prior art. The intention, in particular, is to provide a power semiconductor module which is compact and can be produced simply and cost-effectively.

According to the invention, the pressure contact between the contact elements and the contact areas is exerted by at least one electrical component arranged between the springs and one of the load connection elements. In a departure from the prior art, according to the invention it is proposed that the pressure contact is produced by an electrical component supported on the load connection element. For this purpose, the spring exerts a pressure on the component, which pressure is transmitted from there to the load connection element. Since the spring is now arranged above the component, a more compact overall design can be achieved.

Within the meaning of the present invention, the term "spring" is understood to mean an elastic element which exerts an elastic restoring force upon compression. The spring can be a spiral spring, a flexible spring tongue, an elastically compressible material, which can be produced, for example, from rubber, an elastic polymer, or an elastic foam, or any suitable resilient element. The term "electrical component" is understood to mean a component which is part of a circuit of the power semiconductor module. The electrical component is substantially rigid, such that a force exerted by the spring element is thereby transmitted to the load connection element.

The electrical component is, in particular, a capacitor, preferably an electrolytic capacitor, which is often a relatively large device. In the case of power semiconductor modules comprising electrolytic capacitors, a particularly compact design can be achieved using the proposed invention.

According to a further embodiment of the invention, an upper housing element accommodating the capacitor is connected to a lower housing element corresponding thereto, said lower housing element accommodating the substrate or being formed by the substrate. The upper and/or lower housing element can be produced from injection-molded plastic, for example. A heat sink may be accommodated in the lower housing element, the substrate then being supported on the heat sink. However, it may also be the case that the lower housing element itself is formed from a heat sink. In this case, the lower housing element may be produced from aluminium, for example.

Advantageously, the upper housing element has a cylindrical cutout for accommodating the capacitor substantially in positively locking fashion. The capacitor can be inserted into the cylindrical cutout during mounting. It is held such that it can be displaced in sliding fashion in the cylindrical cutout.

The spring may be provided between a cover of the cutout and a capacitor accommodated in the cutout. Expediently, the spring is produced from a permanently elastic foam element or formed in the manner of a spring tongue. The spring is expediently integrally formed on the cover of the cutout, and may be formed, for example, from a spring tongue integrally formed on the cover.

According to a further embodiment of the invention, a first connection extending from the capacitor is connected to one of the first contact elements and a second connection extending from the capacitor is connected to one of the second contact elements. In other words, the capacitor is thus directly connected to the load connection elements.

The second load connection element has at least one perforation through which one of the first contact elements and/or a first connection are/is led. The structural size of the power semiconductor module can thus be reduced further.

The connections may be soldered or welded to the contact elements. However, it may also be the case that the connections are clamped between the contact areas and the contact elements. That simplifies the production of the power semiconductor module. A clamping force for holding the connections is expediently produced by the spring, which forces the contact elements against the contact areas.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

An exemplary embodiment of the invention is explained in greater detail below with reference to the drawings, in which.

DETAILED DESCRIPTION OF THE PRESENTLY PREFERRED EMBODIMENTS

Figure 1:
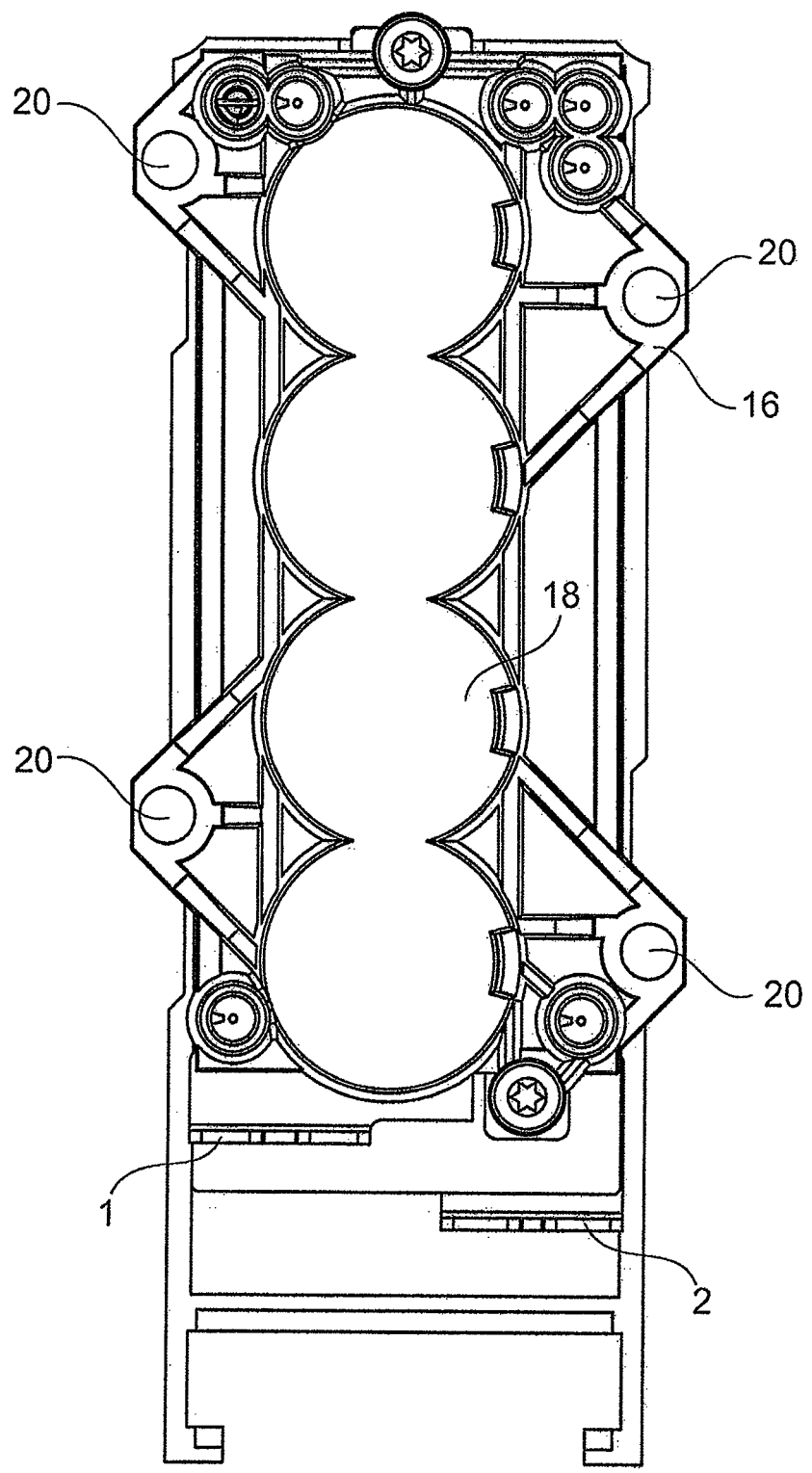
FIG. 1 is a plan view of a power semiconductor module
Figure 2:
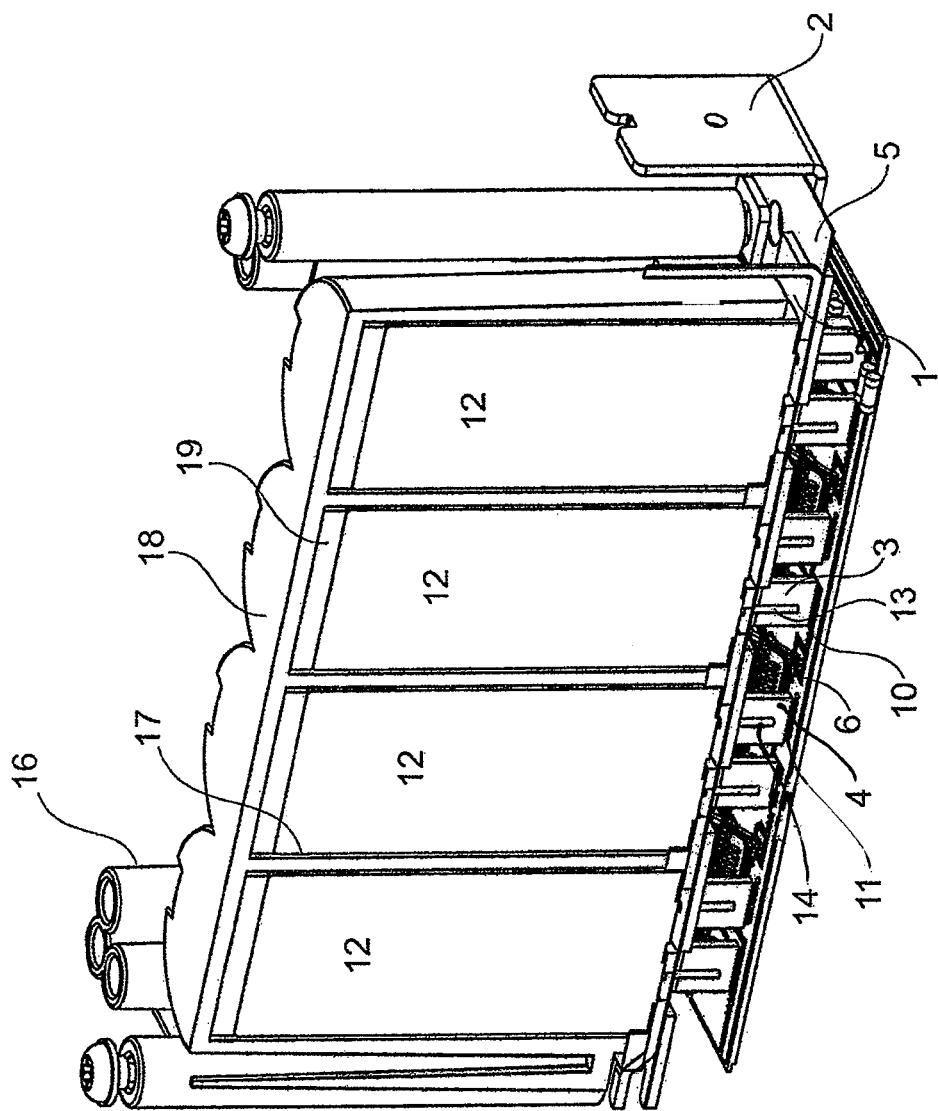
FIG. 2 is a first perspective sectional view in accordance with FIG. 1.

In the figures, a first load connection element is shown generally at 1 and a second load connection element is shown generally at 2. First and second load connection elements 1, 2 are in each case formed from a plate-type metal body having first contact feet 3 and second contact feet 4 extending therefrom. First and second load connection elements 1, 2 are stacked one above the other with an electrically insulating layer 5 disposed therebetween. Second load connection element 2 and electrically insulating layer 5 in each case have perforations 6 through which first contact feet 3 extend.

A substrate 7, produced using DCB technology, for example, accommodates power semiconductors 8 therein. Power semiconductors 8 are connected to first contact areas 10 and second contact areas 11 by means of bonding wires 9. The first and/or second contact areas 10, 11 may also be formed from a plurality of bonding wires 9 that are arranged alongside one another and bear on substrate 7. First contact feet 3 are in electrical contact with first contact areas 10; second contact feet 4 are in electrical contact with second contact areas 11.

Electrolytic capacitors 12 have first connections 13 which are electrically connected to first contact feet 3 and second connections 14 which are respectively electrically connected to second contact feet 4. In this case, the connection may be effected by soldering or welding, for example. It is also conceivable that first and/or second connections 13, 14 are led around a lower edge of contact feet 3, 4 and are clamped between contact feet 3, 4 and contact areas 10, 11. For this purpose, a cutout (not shown) for inserting the connections 13, 14 may be provided in the region of the lower edge of contact feet 3, 4.

Figure 3:
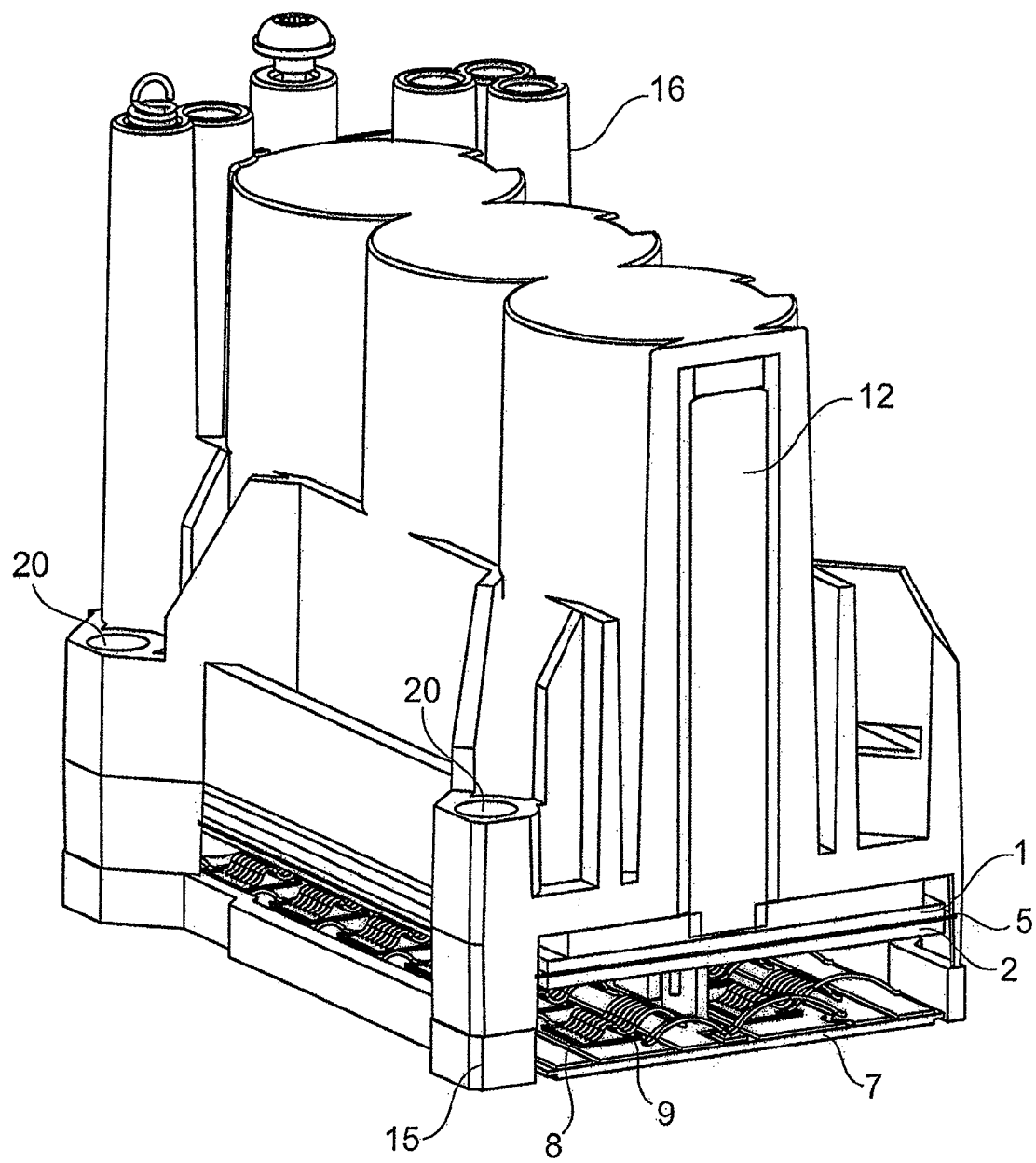
FIG. 3 is a second perspective sectional view in accordance with FIG. 1.

As can be seen from FIG. 3, in particular, substrate 7 is accommodated in a lower housing element 15. An upper housing element 16, has a cylindrical cutout 17 for each electrolytic capacitor 12. Electrolytic capacitors 12 are inserted into cylindrical cutouts 17 so that they may be slidably displaced. A cover 18 closes off each cylindrical cutout 17. A spring embodied here in the form of an elastic compressible foam element 19 is inserted between cover 18 and electrolytic capacitors 12. Foam element 19 is expediently embodied as a disc.

For the assembly of the power semiconductor module, firstly electrically insulating layer 5 and second load connection element 2 thereon are stacked onto first connection element 1 so that first contact feet 3 are led through perforations 6 provided in electrically insulating layer 5 and second load connection element. First connections 13 of electrolytic capacitors 12 are then connected to first contact feet 3 of first load connection element 1, for example by soldering or friction welding. Afterwards, second connections 14 are connected to second contact feet 4, for example once again by soldering or friction welding. Electrolytic capacitors 12 are then inserted into cylindrical cutouts 17. Finally, upper housing element 14 is screwed to lower housing by screws (not shown here) introduced through screw holes 20. In this case, foam elements 19 are compressed and electrolytic capacitors 12 are forced against load connection elements 1, 2, such that contact feet 3, 4 are in turn forced against respective contact areas 10, 11. It is thus possible to produce a secure and reliable contact between contact feet 3, 4 and contact areas 10, 11. Assembly is simple. Since the pressure for producing the pressure contact between contact feet 3, 4 and contact areas 10, 11 is exerted on load connections elements 1, 2 by electrolytic capacitors 12, a particularly compact construction of the power semiconductor module is achieved.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve substantially the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A power semiconductor module comprising:
   a substrate provided with at least one power semiconductor therein, and including first and second contact areas;
   a first load connection element having first contact elements supported on said first contact areas;
   a second load connection element having second contact elements supported on said second contact areas;
   at least one spring for producing a pressure contact between said first and second contact elements and first and second said contact areas, respectively; and
   at least one electrical component disposed for applying pressure between said first and second contact elements and said first and second contact areas, said at least one electrical component being disposed between said spring and one of said load connection elements.

2. The power semiconductor module of claim 1, wherein said electric component is a capacitor.

3. The power semiconductor module of claim 2, wherein said capacitor is an electrolytic capacitor.

4. The power semiconductor module of claim 1, wherein an upper housing element accommodating said electrical component is connected to a lower housing element corresponding thereto, said lower housing element including said substrate.

5. The power semiconductor module of claim 4, wherein said upper housing element has at least one cylindrical cutout for accommodating said electrical component in substantially positively locking fashion.

6. The power semiconductor module of claim 1, wherein said spring is disposed between a cover of a cutout in the module and said electrical component.

7. The power semiconductor module of claim 1, wherein said spring is a permanently elastic foam.

8. The power semiconductor module of claim 1, wherein said spring is a spring tongue.

9. The power semiconductor module of claim 1, wherein said spring is integrally formed in a cover of a cutout.

10. The power semiconductor module of claim 1, wherein a first connection extending from said electrical component is connected to one of said first contact elements and a second connection extending from said electrical component is connected to one of said second contact elements.

11. The power semiconductor module of claim 10, wherein said second load connection element has at least one perforation through which at least one of said first contact elements and said first connection extends.

12. The power semiconductor module of claim 11, wherein at least some of said first and second connections are connected to said contact elements by one of soldering or welding.

13. The power semiconductor module of claim 10, wherein at least some of said first and second connections are clamped between at least one of said first and second contact areas and at least one of said first and second contact elements.

\* \* \* \* \*